(12) United States Patent
Wang et al.

(10) Patent No.: US 12,176,473 B1
(45) Date of Patent: Dec. 24, 2024

(54) LED PACKAGING STRUCTURE

(71) Applicants: Peng Wang, Nanchang (CN); Jueming Li, Nanchang (CN)

(72) Inventors: Peng Wang, Nanchang (CN); Jueming Li, Nanchang (CN)

( * ) Notice: Subject to any disclaimer, the term of this patent is extended or adjusted under 35 U.S.C. 154(b) by 0 days.

(21) Appl. No.: 18/632,494

(22) Filed: Apr. 11, 2024

(51) Int. Cl.
| | |
|---|---|
| *H01L 33/64* | (2010.01) |
| *H01L 25/065* | (2023.01) |
| *H01L 25/07* | (2006.01) |
| *H01L 25/075* | (2006.01) |
| *H01L 25/16* | (2023.01) |
| *H01L 27/15* | (2006.01) |
| *H01L 33/62* | (2010.01) |

(52) U.S. Cl.
CPC ........ *H01L 33/641* (2013.01); *H01L 25/0655* (2013.01); *H01L 25/072* (2013.01); *H01L 25/0753* (2013.01); *H01L 25/167* (2013.01); *H01L 27/153* (2013.01); *H01L 33/62* (2013.01); *H01L 2924/1203* (2013.01); *H01L 2924/12043* (2013.01); *H01L 2924/12044* (2013.01); *H01L 2924/19043* (2013.01); *H01L 2933/0075* (2013.01)

(58) Field of Classification Search
CPC ... H01L 2924/1203; H01L 2924/12043; H01L 2924/12044; H01L 2924/19043; H01L 33/641; H01L 33/62; H01L 25/167; H01L 25/0753; H01L 25/072; H01L 25/0655; H01L 24/49; H01L 27/153
See application file for complete search history.

(56) References Cited

U.S. PATENT DOCUMENTS

| | | | |
|---|---|---|---|
| 2005/0274957 A1 | 12/2005 | Wang et al. | |
| 2007/0164683 A1* | 7/2007 | Allen | H05B 45/00 315/200 R |
| 2008/0017877 A1 | 1/2008 | Li et al. | |
| 2008/0157686 A1* | 7/2008 | Chung | H05B 45/355 315/185 S |
| 2010/0052001 A1 | 3/2010 | Li et al. | |
| 2012/0320595 A1* | 12/2012 | Enke | H05B 45/00 257/E33.059 |

(Continued)

FOREIGN PATENT DOCUMENTS

CN          104600181 A  *  5/2015

*Primary Examiner* — Alonzo Chambliss
(74) *Attorney, Agent, or Firm* — Hemisphere Law, PLLC; Zhigang Ma (57) ABSTRACT

The present disclosure discloses a light-emitting diode (LED) packaging structure, including a bracket, wherein at least two rectifier chips are mounted on the bracket; an internal circuit and a voltage reduction resistor are mounted on the bracket; at least one light-emitting chip is also mounted on the bracket; the light-emitting chip is connected in parallel or series with the rectifier chips through metal wires to form an internal rectifier circuit; and the internal rectifier circuit is formed into a complete internal circuit through voltage reduction or current-limiting protection of the voltage reduction resistor. The LED packaging structure of the present disclosure can make an LED to emit light when driven directly by alternating current power, so that the LED packaging structure can be better used in fields such as product assembling, product application, and product cost, and more resources can be saved.

12 Claims, 7 Drawing Sheets

(56) References Cited

U.S. PATENT DOCUMENTS

| | | | |
|---|---|---|---|
| 2014/0131749 A1* | 5/2014 | Yao | H01L 25/0753 257/89 |
| 2018/0112831 A1* | 4/2018 | Huang | H01L 25/0753 |
| 2021/0172573 A1* | 6/2021 | Liu | H01L 33/62 |

* cited by examiner

LED PACKAGING STRUCTURE

TECHNICAL FIELD

The present disclosure relates to the technical field of light-emitting diode (LED) light source bodies, and in particular, to an LED packaging structure.

BACKGROUND

An existing LED packaging structure is still a strip-shaped or specially-shaped LED filament capable of emitting light, which is formed by adding a chip, fluorescent powder, a packaging adhesive, and other materials based on traditional brackets, such as a ceramic bracket, a sapphire bracket, and a glass bracket, through technological packaging, but this LED packaging structure is only used in products controlled by power. In the technical field of lighting, an existing filament-packaged LED light source has gradually replaced an original corn bulb lamp or an energy-saving lamp as a new generation of mainstream light source for illumination since the existing filament-packaged LED light source is driven by a direct current power supply and has the advantages of low energy consumption, high applicability, high stability, multicolor emission, and the like. However, due to its nature, a filament LED can only be driven to emit light after alternating current power is converted into direct current power using an external power supply. This is hereby invented: The traditional external power supply is removed, and a metal bracket is used for better heat dissipation; the luminous efficiency is higher, and the ability to directly use wide voltage and AC and DC power can also stably drive strip metal LED light-emitting devices. A strip-shaped metal LED luminous device can also be normally driven in a case of directly using alternating current power and direct current power with wide voltages.

SUMMARY

In order to solve the above shortcomings in the prior art, the present disclosure provides an alternating current and direct current LED filament package.

In order to solve the above technical problems, the present disclosure adopts the following technical solutions: An LED packaging structure includes a bracket (4), wherein at least two rectifier chips (1) are mounted on the bracket (4), and an internal circuit and a voltage reduction resistor (2) are mounted on the bracket (4);

at least one light-emitting chip (3) is also mounted on the bracket (4); the light-emitting chip (3) is connected in parallel or series with the rectifier chips (1) through metal wires to form an internal rectifier circuit; and the internal rectifier circuit is formed into a complete internal circuit through voltage reduction or current-limiting protection of the voltage reduction resistor (2).

Preferably, the bracket (4) is arranged in a long strip shape, and two groups of rectifier chips (1) are mounted on two sides of an upper end of the bracket (4); the voltage reduction resistor (2) is also mounted on one side of the bracket ((4); there are a plurality of light-emitting chips (3); the plurality of light-emitting chips (3) are connected in parallel or series with the rectifier chips (1) through the metal wires to form the internal rectifier circuit; and bonding pads of the various chips in the bracket (4) are connected in parallel or series.

Preferably, a groove (6) is formed in the bracket (4), and a plurality of rectifier chips (1) and one or more light-emitting chips (3) are mounted in the groove (6).

Preferably, an electrode dividing plate (7) is mounted in the middle in the groove (6), and a plurality of rectifier chips (1) are symmetrically mounted on left and right sides of the electrode dividing plate (7).

Preferably, after a complete rectifier circuit is formed by connection inside the groove (6) by using the rectifier chips (1), the rectifier circuit is directly connected to the LED light-emitting chips in series or parallel through the metal wires at points P and N, and then fluorescent powder and silica gel or an LED packaging adhesive are mixed; and after the mixing is completed, the complete LED packaging structure is formed by braiding through dispensing and beam splitting processes.

Preferably, the voltage reduction resistor (2), the rectifier chips (1), and the light-emitting chips (3) are fixedly connected into the bracket (4) through an adhesive.

Preferably, the LED packaging structure further includes a mixed packaging adhesive (5) for packaging the bracket (4), the rectifier chips (1), the voltage reduction resistor (2), and the light-emitting chips (3) to form a complete LED packaging structure.

Preferably, the mixed packaging adhesive (5) is a mixture of fluorescent powder and diamond, and the adhesive is a solid crystal glue or silver glue.

Preferably, the bracket (4) is one of a metal bracket, a thermal conductive plastic bracket, and a crystal bracket.

Preferably, a preparation method of the bracket (4) includes the following steps:

S1. preparing a thermal conductive layer by uniformly mixing a thermal conductive silicone grease composite material, diamond, and ceramic powder, wherein a mass ratio of the thermal conductive silicone grease composite material, the diamond powder, and the ceramic powder is 1:(0.2-0.4):(0.1-0.3);

S2. fusing and stirring nickel, aluminum, and copper at a high temperature to prepare a metal plate, wherein a mass ratio of the nickel, the aluminum, and the copper is (0.1-0.3):1:1; and S3. after preparing the metal plate into the desired bracket, applying the thermal conductive layer onto the bracket.

Preferably, a preparation method of the thermal conductive layer comprises: adding a total of 30% of diamond powder and a total of 65% of ceramic powder into the thermal conductive silicone grease composite material at a temperature of 25° C.-30° C., stirring the material for fusion, then heating, after the fusion, the mixture to 75° C. at a heating rate of 2-4° C./min, and maintaining the temperature for 30-65 min; and after the thermal insulation is completed, cooling the mixture to 45-50° C. at a cooling rate of 1-2° C./min, then continuing to add the remaining diamond powder and ceramic powder, and stirring the material for fusion, wherein the fusion is carried out in an environment of ultrasonic dispersion for 20 to 45 min at a second fusion frequency of 250 Hz to 600 Hz and the power of 200 to 250 W, thus obtaining the thermal conductive layer after the fusion.

Preferably, a preparation method of the thermal conductive silicone grease composite material includes: adding bentonite and sodium dodecyl sulfate into silicone grease at the room temperature, stirring the components for modification, and performing ultrasonic dispersion for 30 to 60 min at a frequency of 200 Hz to 500 Hz and the power of 100 to 200 W to obtain the thermal conductive silicone grease composite material; and a mass ratio of the thermal conductive silicone grease, the bentonite, and the sodium dodecyl sulfate is 1:0.4:0.2.

Preferably, a mounting method of the internal circuit comprises: spraying a layer of insulating oil on the bracket first, spraying powder or coating an insulating layer on the metal bracket, then brushing a silver layer on a top of the metal bracket, and mounting the internal circuit.

Preferably, a mounting method of the internal circuit is a packaging technology for directly bonding a flexible circuit board such as a flexible printed circuit (FPC) or other high-temperature-resistant flexible insulating circuit board to a specially-shaped metal or alloy bracket.

Compared with the prior art, the present disclosure has the beneficial effects below:

During use, as described in this invention patent, traditional electronic elements are assembled into a large volume, and the process of assembling a finished product is complex and has high assembling cost; and an external power supply is easily affected by conditional factors such as production and usage environments, causing damage to the power supply. In the present disclosure, a traditional surface mounted device (SMD) packaging technology and a power supply technology are integrated into an LED filament packaging technology, thus reducing the influence of the external power supply factor and making an LED to emit light when the LED filament is driven directly by alternating current power, so that the LED packaging structure can be better used in fields such as product assembling, product application, and product cost, and more resources can be saved.

The diamond has high hardness and high thermal conductivity. When the diamond is combined with the thermal conductive silicone grease and the ceramic powder, a frequency between atoms and lattices is reduced. Under the influence of interaction, the vibrations of the atoms and the lattices are changed, thereby improving the thermal conductivity.

Materials such as metal or alloy are prepared into brackets in various forms (various special shapes such as stripe shape, circle, and semicircle) through a mold or other processes. Various printed circuit board (PCB)-like electronic circuits are attached to the bracket according to the product requirements. Then, one or more rectifier chips, capacitors, resistors, and other electronic elements are used to form the internal rectifier circuit. Then, the internal rectifier circuit and the one or more LED light-emitting chips are welded onto the bracket using metal wires such as gold or alloy wires through a professional welding machine. In this way, the complete internal circuit is formed. A complete LED filament that can be directly used in alternating current power by using the specified LED packaging adhesive and other LED packaging processes. According to this packaging technology, the LED filament can have higher heat dissipation speed and better thermal conductivity. Meanwhile, an external voltage reduction resistor can be used or a voltage reduction resistor or a current-limiting resistor can be added outside the metal bracket. According to the diode characteristic of the alternating current LED filament of the present disclosure, monocrystalline or polycrystalline LED chips are used to be connected in series or in parallel to form a complete LED metal filament or an alloy filament.

Numerals in the drawings: 1: rectifier chip; 2: voltage reduction resistor; 3: light-emitting chip; 4: bracket; 5: packaging adhesive; 6: groove; and 7: electrode dividing plate.

DETAILED DESCRIPTION OF THE EMBODIMENTS

In the descriptions of the present invention, it should be understood that orientations or positional relationships indicated by the terms "center", "longitudinal", "transverse", "upper", "lower", "front", "rear", "left", "right", "vertical", "horizontal", "top", "bottom", "inner", "outer", and the like are orientations or positional relationships as shown in the drawings, and are only for the purpose of facilitating and simplifying the descriptions of the present invention instead of indicating or implying that devices or elements indicated must have particular orientations, and be constructed and operated in the particular orientations, so that these terms are not construed as limiting the present invention. In the descriptions of the present disclosure, "a plurality" means two or more, unless otherwise specified.

The present disclosure will be described in detail below with reference to the accompanying drawings and embodiments.

The embodiments of the present disclosure provide an LED packaging structure. The packaging structure includes two specific forms, namely, a long-strip-type filament packaging structure and an SMD packaging structure.

Embodiment 1

As shown in FIG. 1 to FIG. 4, an alternating current/direct current LED filament package includes a bracket 4. Two groups of rectifier chips 1 are mounted on two sides directly above the bracket 4, and a resistor 2 is also mounted on one side. The position of the resistor 2 can be set according to client requirements in an actual situation. An internal circuit is mounted on the bracket. A mounting method of the internal circuit includes: spraying a layer of insulating oil on the bracket first, then brushing a silver layer on a top of the bracket, and mounting the internal circuit, or a mounting method of the internal circuit is a packaging technology for directly bonding a flexible circuit board such as an FPC or other high-temperature-resistant flexible insulating circuit board to a specially-shaped metal or alloy bracket.

Figure 3:
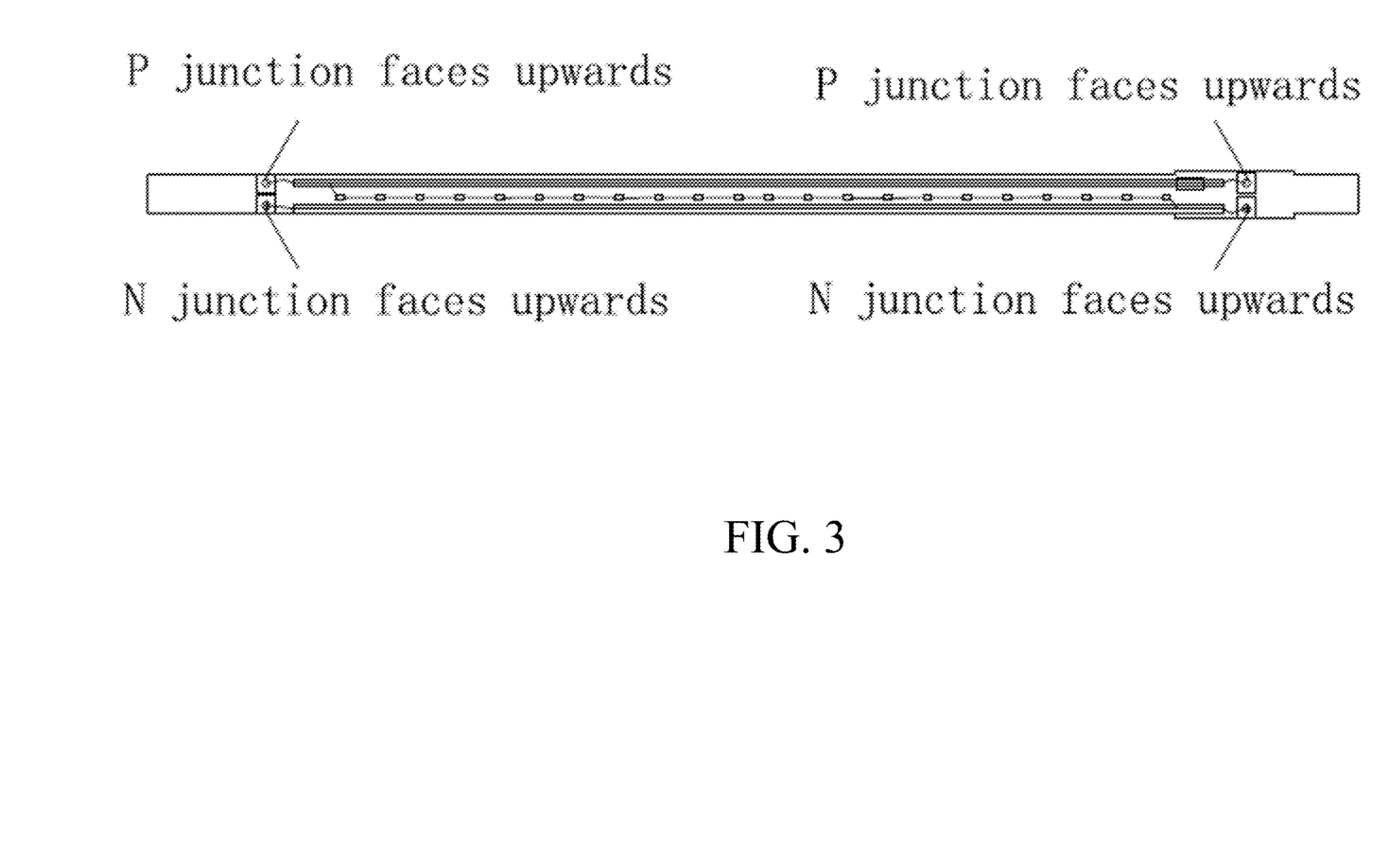
FIG. 3 is a schematic diagram of circuit placement of an LED packaging structure according to an embodiment of the present disclosure.
Figure 4:
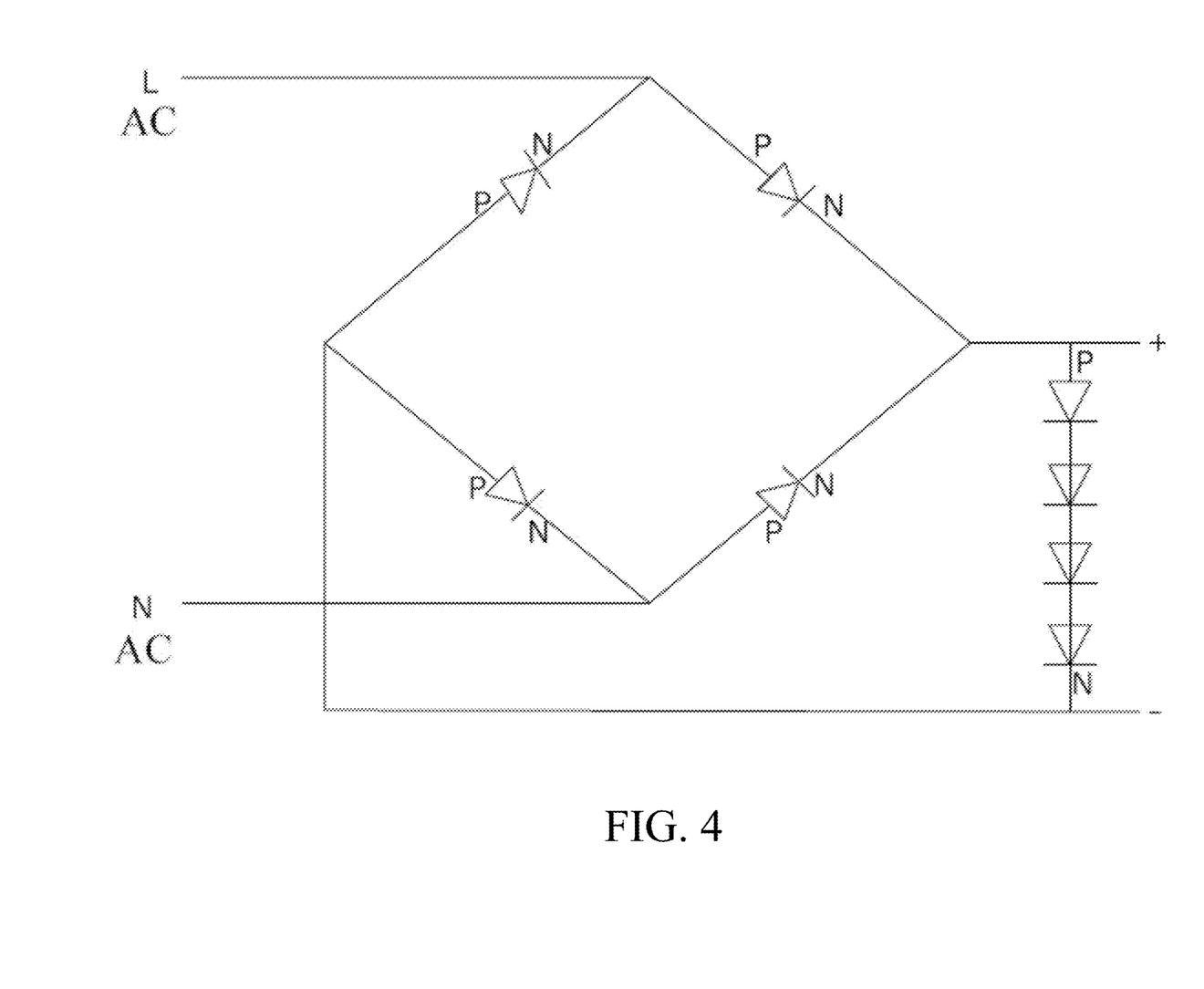
FIG. 4 is a schematic diagram of an internal circuit of the present disclosure.
Figure 5:
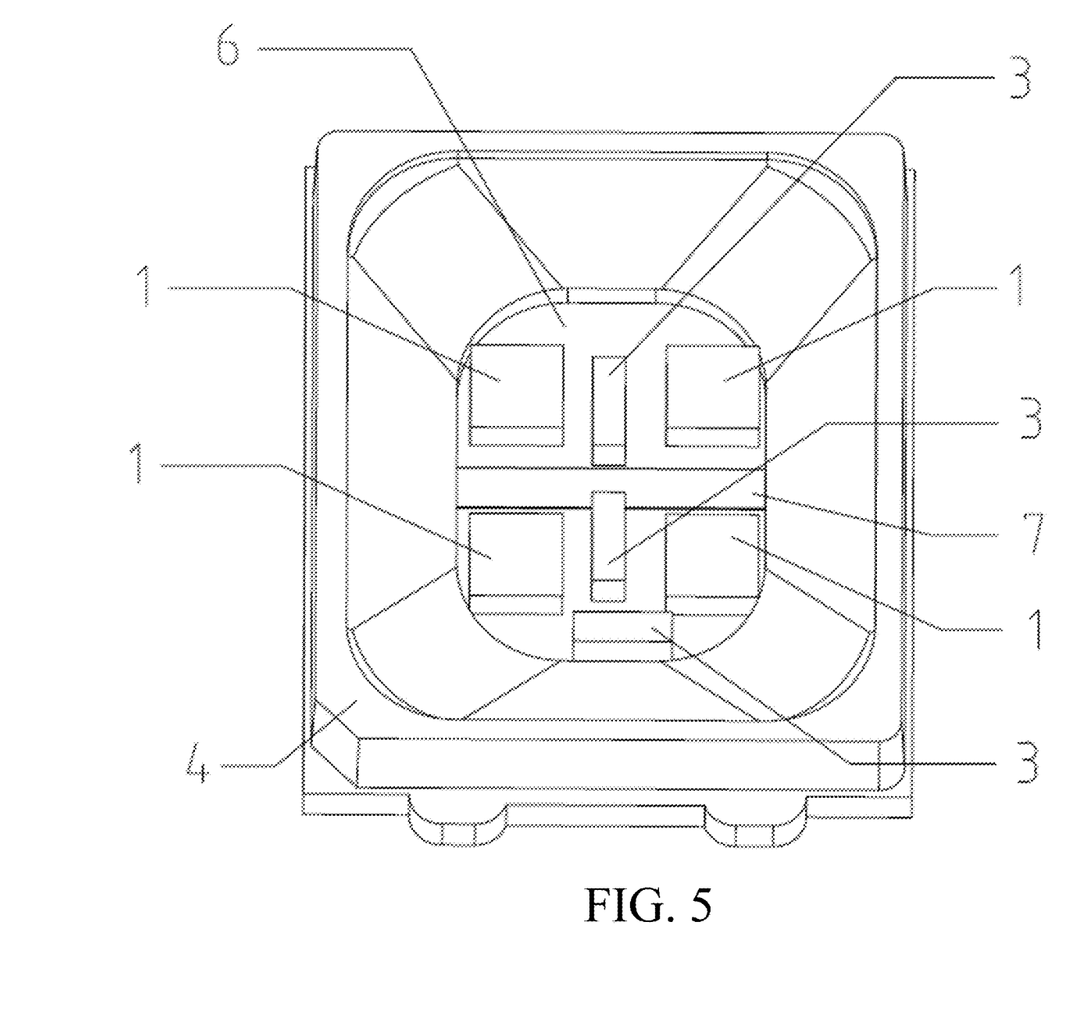
FIG. 5 is a schematic structural diagram of an LED packaging structure according to another embodiment of the present disclosure.
Figure 6:
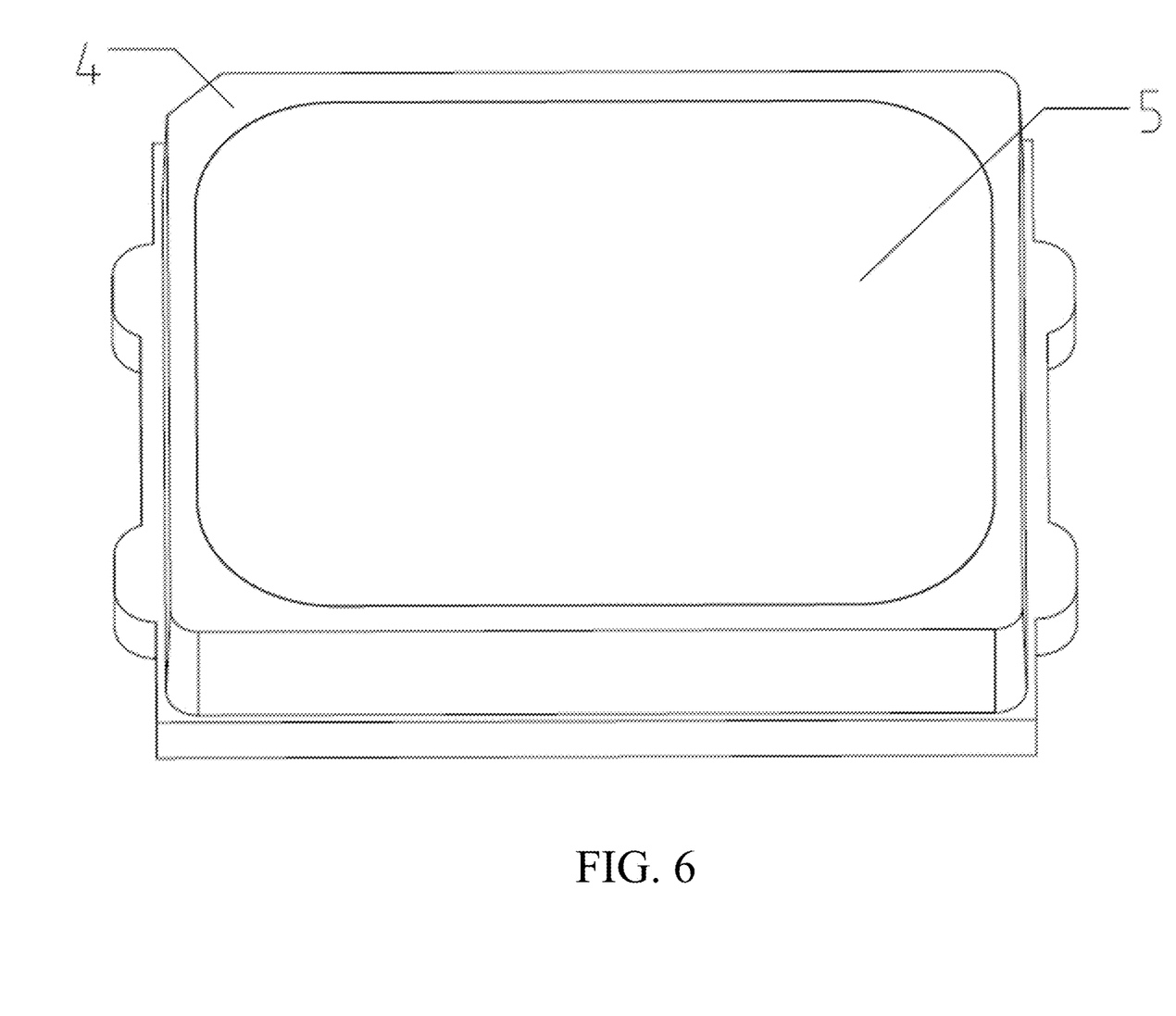
FIG. 6 is a schematic structural diagram of a packaging colloid of the LED packaging structure in FIG. 5.

A plurality of light-emitting chips 3 are also mounted at a middle section of the bracket 4. The light-emitting chips 3 are arranged in sequence and form an internal rectifier circuit with the rectifier chips 1 through metal wires. The internal rectifier circuit is specifically as shown in FIG. 4. The internal rectifier circuit is connected in parallel or in series to the light-emitting chips 3. Bonding pads of the various chips in the bracket 4 are connected in parallel or in series to form a complete internal circuit. The two groups of rectifier chips 1 on the two sides of bracket 4 are as follows: A positive electrode of one group faces upwards, and a negative electrode of the other group faces upwards. For the light-emitting chips 3 close to the rectifier chips 1, their positive electrodes face upwards. The light-emitting chips 3 are placed in a manner of connecting the positive and negative electrodes in sequence from left to right, specifically as shown in FIG. 3.

Figure 1:
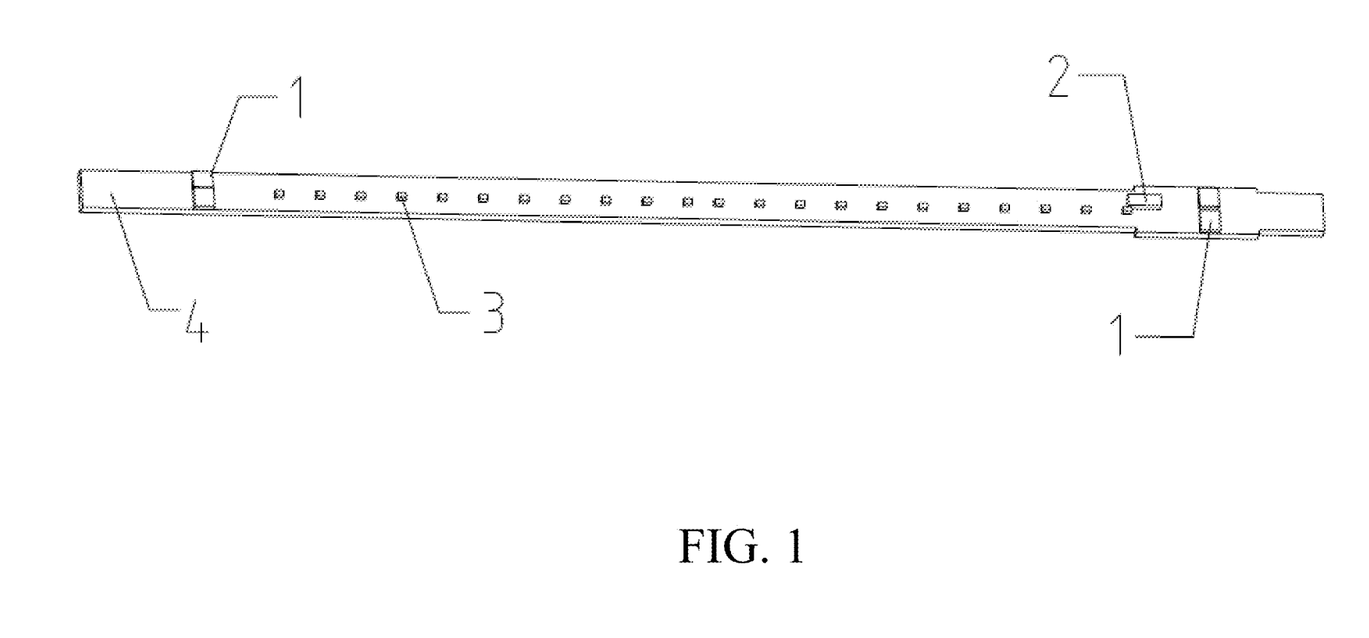
FIG. 1 is a schematic structural diagram of an LED packaging structure according to an embodiment of the present disclosure.
Figure 2:
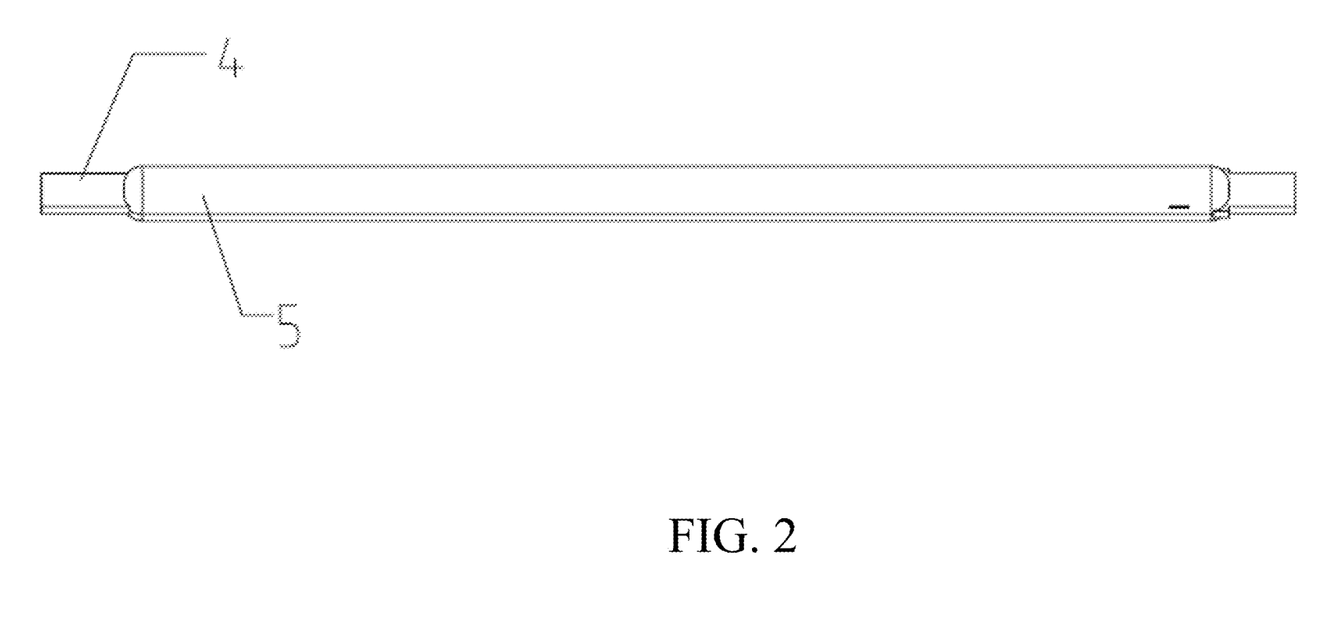
FIG. 2 is a schematic structural diagram of a packaging adhesive of the LED packaging structure in FIG. 1.

In this embodiment, electronic devices such as the resistor 2, the rectifier chips 1, and the light-emitting chips 3 are fixedly connected into the bracket 4 through an adhesive. After all the electronic devices are mounted, they are packaged into a complete alternating current and direct current LED metal filament luminophor through a mixed packaging adhesive 5. The adhesive is solid crystal glue or silver glue, and the mixed packaging adhesive 5 is a mixture of fluorescent powder and diamond, specifically as shown in FIG. 2.

In this embodiment, the bracket 4 is a metal bracket or a thermal conductive plastic bracket. In this embodiment, the material of the bracket can be any material with thermal conductivity and high strength.

Embodiment 2

Compared with Embodiment 1, this embodiment has a different that a mounting method of the internal circuit is a packaging technology for directly bonding a flexible circuit board such as an FPC or other high-temperature-resistant flexible insulating circuit board to a specially-shaped metal or alloy bracket.

Embodiment 3

Compared with Embodiment 1, this embodiment has a difference that a preparation method of the bracket includes the following steps:
- S1. A total of 30% of diamond and a total of 65% of ceramic powder were added into a thermal conductive silicone grease composite material at a temperature of 25° C., and the material was stirred for fusion; after the fusion, the mixture was heated to 75° C. at a heating rate of 2° C./min, and the temperature was maintained for 30 min; and after the thermal insulation was completed, the mixture was cooled to 45° C. at a cooling rate of 1° C./min; the remaining diamond and ceramic powder were continued to be added, and the material was stirred for fusion, wherein the fusion was carried out in an environment of ultrasonic dispersion for 205 min at a second fusion frequency of 250 Hz and the power of 200 W, thus obtaining the thermal conductive layer after the fusion. A mass ratio of the thermal conductive silicone grease composite material, the diamond, and the ceramic powder was 1:0.2:0.1.
- S2. Nickel, aluminum, and copper were fused and stirred at a high temperature to prepare a metal plate, wherein a mass ratio of the nickel, the aluminum, and the copper was 0.1:0.3:1.
- S3. After the metal plate was prepared into the desired bracket, a thermal conductive layer was applied onto the bracket.

A preparation method of the thermal conductive silicone grease composite material includes: Bentonite and sodium dodecyl sulfate were added into thermal conductive silicone grease at the room temperature; the components were stirred for modification; and ultrasonic dispersion was performed for 30 min at a frequency of to 200 Hz and the power of 100 W to obtain the thermal conductive silicone grease composite material, wherein mass ratio of the thermal conductive silicone grease, the bentonite, and the sodium dodecyl sulfate was 1:0.4:0.2.

Embodiment 4

Compared with Embodiment 1, this embodiment has a difference that a preparation method of the bracket includes the following steps:
- S1. A total of 30% of diamond and a total of 65% of ceramic powder were added into a thermal conductive silicone grease composite material at a temperature of 27° C., and the material was stirred for fusion; after the fusion, the mixture was heated to 75° C. at a heating rate of 3° C./min, and the temperature was maintained for 57 min; and after the thermal insulation was completed, the mixture was cooled to 50° C. at a cooling rate of 1° C./min; the remaining diamond and ceramic powder were continued to be added, and the material was stirred for fusion, wherein the fusion was carried out in an environment of ultrasonic dispersion for 40 min at a second fusion frequency of 420 Hz and the power of 230 W, thus obtaining the thermal conductive layer after the fusion. A mass ratio of the thermal conductive silicone grease composite material, the diamond, and the ceramic powder was 1:0.3:0.2.
- S2. Nickel, aluminum, and copper were fused and stirred at a high temperature to prepare a metal plate, wherein a mass ratio of the nickel, the aluminum, and the copper was 0.1:0.3:1.
- S3. After the metal plate was prepared into the desired bracket, a thermal conductive layer was applied onto the bracket.

A preparation method of the thermal conductive silicone grease composite material includes: Bentonite and sodium dodecyl sulfate were added into thermal conductive silicone grease at the room temperature; the components were stirred for modification; and ultrasonic dispersion was performed for 55 min at a frequency of to 450 Hz and the power of 140 W to obtain the thermal conductive silicone grease composite material, wherein mass ratio of the thermal conductive silicone grease, the bentonite, and the sodium dodecyl sulfate was 1:0.4:0.2.

Embodiment 5

Compared with Embodiment 1, this embodiment has a difference that a preparation method of the bracket includes the following steps:
- S1. A total of 30% of diamond and a total of 65% of ceramic powder were added into a thermal conductive silicone grease composite material at a temperature of 30° C., and the material was stirred for fusion; after the fusion, the mixture was heated to 75° C. at a heating rate of 4° C./min, and the temperature was maintained for 65 min; and after the thermal insulation was completed, the mixture was cooled to 50° C. at a cooling rate of 2° C./min; the remaining diamond and ceramic powder were continued to be added, and the material was stirred for fusion, wherein the fusion was carried out in an environment of ultrasonic dispersion for 45 min at a second fusion frequency of 600 Hz and the power of 250 W, thus obtaining the thermal conductive layer after the fusion. A mass ratio of the thermal conductive silicone grease composite material, the diamond, and the ceramic powder was 1:0.4:0.3.

Nickel, aluminum, and copper were fused and stirred at a high temperature to prepare a metal plate, wherein a mass ratio of the nickel, the aluminum, and the copper was 0.1:1:1.

S3. After the metal plate was prepared into the desired bracket, a thermal conductive layer was applied onto the bracket.

A preparation method of the thermal conductive silicone grease composite material includes: Bentonite and sodium dodecyl sulfate were added into thermal conductive silicone grease at the room temperature; the components were stirred for modification; and ultrasonic dispersion was performed for 60 min at a frequency of to 500 Hz and the power of 200 W to obtain the thermal conductive silicone grease composite material, wherein mass ratio of the thermal conductive silicone grease, the bentonite, and the sodium dodecyl sulfate was 1:0.4:0.2.

Embodiment 6

Figure 7:
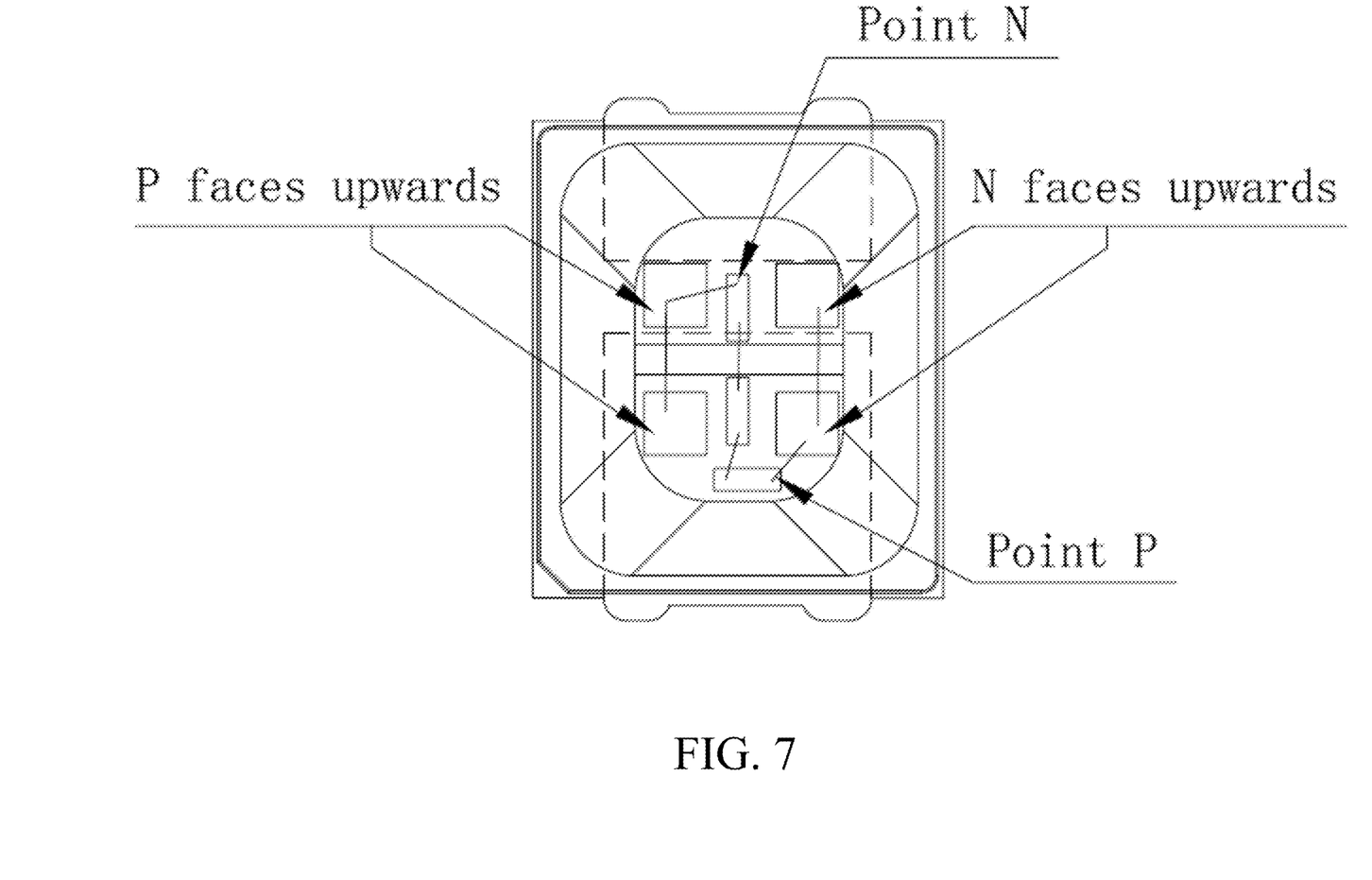
FIG. 7 is a schematic diagram of mounting of the LED packaging structure in FIG. 5.

As shown in FIG. 4 to FIG. 7, an alternating current/direct current SMDLED packaging technology included a bracket 4. The bracket 4 was provided with a groove 6. An electrode boundary 7 was mounted in the middle in the groove 6. Two rectifier chips 1 and a plurality of light-emitting chips 3 were mounted on each of two sides of the electrode boundary 7. As shown in FIG. 7, for the left rectifier chips 1, their Ps all faced upwards, and for the right rectifier chips 1, their Ns all faced upwards. The rectifier chips were connected in series or in parallel with the three light-emitting chips 3 through metal wires according to P points and N points to form a complete internal circuit. It should be noted that by the adoption of the plurality of light-emitting chips 3, an LED of this embodiment could be 1 W to 3 W.

An adhesive was used to fixedly mount a single rectifier chip 1, the plurality of light-emitting chips 3, a current-limiting resistor, a capacitor, and other electronic elements or element chips on the bracket 4. The light-emitting chips 3 were connected to the rectifier chip 1 in parallel or in series through the metal wires, and a complete external and internal circuit was formed by the voltage reduction or current-limiting protection through the voltage reduction resistor. An electronic element such as the voltage reduction resistor (not shown in the figure) and the capacitor could also be connected to an outer end or outside the bracket 4. The internal rectifier circuit was specifically as shown in FIG. 4. In the groove 6 of the bracket 4, after the complete rectifier circuit was formed by connecting the rectifier chips 1, the complete rectifier circuit was directly connected to the LED light-emitting chips 3 in series or in parallel through the metal wires at the P points and the N points. Fluorescent powder and silica gel were mixed according to proportions that met different color temperature requirements. The proportions could be changed by those skilled in the art according to the actual requirements. The present disclosure did not have specific limitations on the proportions. After completion, a complete alternating current/direct current SMDLED (traditional SMDLED) was formed by braiding through dispensing and beam splitting processes. After the mounting was completed, a complete internal rectifier and LED light-emitting circuit was formed by connecting the rectifier chips 1 in series or in parallel with one or more LED light-emitting chips 3. A current-limiting resistor could also be mounted in the groove. Whether the current-limiting resistor needs to be mounted and a mounting position could be selected according to an actual situation.

In this embodiment, the adhesive was either solid crystal glue or silver glue.

In this embodiment, the mixed packaging adhesive 5 was a mixture of the fluorescent powder and the silica gel.

Embodiment 7

A difference between this embodiment and Embodiment 1 was that there was one light-emitting chip and four rectifier chips in this embodiment. P junctions of two of the four rectifier chips faced upwards, and N junctions of the other two rectifier chips faced upwards. The light-emitting chip and the rectifier chips were connected through metal wires to form a complete bridge rectifier circuit. Then, the P and N junctions of the LED light-emitting chip were connected in series through a metal wire to form a complete internal circuit. This design could be applied to an SMDLED ranging from 0.1 W to 0.5 W. Meanwhile, An LED with 0.1 W or above could also be formed according to the quantity of the LED light-emitting chips.

Comparative Example 1

Compared with Embodiment 3, the bracket of comparative example 1 was a copper alloy bracket. Copper in copper alloy accounted for 80%, and zinc accounted for 20%. Remaining elements were the same as those in Embodiment 3.

Comparative Example 2

Compared with Embodiment 3, the bracket of comparative example 2 was an Epoxy Molding Compound (EMC) bracket. Remaining elements were the same as those in Embodiment 3.

The brackets prepared in Embodiments 3 to 5 and the brackets in the comparative examples 1 to 2 were experimentally compared. Specific data were found in Table 1.

TABLE 1

| | Embodiment 3 | Embodiment 4 | Embodiment 5 | Comparative example 1 | Comparative example 2 |
|---|---|---|---|---|---|
| Resistivity Ω · m (20%) | 1.458 | 1.365 | 1.382 | 1.641 | 1.539 |
| Thermal conductivity (W/(m · K)) | 425 | 487 | 454 | 401 | 387 |

It can be seen from Table 1 that Embodiment 4 is an optimal solution.

The foregoing embodiments merely express several implementations of the present disclosure. The descriptions thereof are relatively specific and detailed, but are not understood as limitations on the scope of the present disclosure. It should be pointed out that a person of ordinary skill in the art can also make several transformations and improvements without departing from the idea of the present disclosure. These transformations and improvements fall within the protection scope of the present disclosure. Therefore, the protection scope of the patent of the present disclosure shall be subject to the appended claims.

What is claimed is:

1. A light-emitting diode (LED) packaging structure, comprising a bracket (4), wherein at least two rectifier chips (1) are mounted on the bracket (4), and an internal circuit and a voltage reduction resistor (2) are mounted on the bracket (4);

at least one light-emitting chip (3) is also mounted on the bracket (4); the light-emitting chip (3) is connected in parallel or series with the rectifier chips (1) through metal wires to form an internal rectifier circuit; and the internal rectifier circuit is formed into a complete internal circuit through voltage reduction or current-limiting protection of the voltage reduction resistor (2); and wherein the bracket (4) is arranged in a long strip shape, and two groups of rectifier chips (1) are mounted on two sides of an upper end of the bracket (4); the voltage reduction resistor (2) is also mounted on one side of the bracket ((4); there are a plurality of light-emitting chips (3); the plurality of light-emitting chips (3) are connected in parallel or series with the rectifier chips (1) through the metal wires to form the internal rectifier circuit; and bonding pads of the various chips in the bracket (4) are connected in parallel or series.

2. The LED packaging structure according to claim 1, wherein a groove (6) is formed in the bracket (4), and a plurality of rectifier chips (1) and one or more light-emitting chips (3) are mounted in the groove (6).

3. The LED packaging structure according to claim 1, wherein an electrode dividing plate (7) is mounted in the middle in the groove (6), and a plurality of rectifier chips (1) are symmetrically mounted on left and right sides of the electrode dividing plate (7).

4. The LED packaging structure according to claim 3, wherein after a complete rectifier circuit is formed by connection inside the groove (6) by using the rectifier chips (1), the rectifier circuit is directly connected to the LED light-emitting chips in series or parallel through the metal wires at points P and N, and then fluorescent powder and silica gel or an LED packaging adhesive are mixed; and after the mixing is completed, the complete LED packaging structure is formed by braiding through dispensing and beam splitting processes.

5. The LED packaging structure according to claim 1, wherein the voltage reduction resistor (2), the rectifier chips (1), and the light-emitting chips (3) are fixedly connected into the bracket (4) through an adhesive.

6. The LED packaging structure according to claim 1, further comprising a mixed packaging adhesive (5) for packaging the bracket (4), the rectifier chips (1), the voltage reduction resistor (2), and the light-emitting chips (3) to form a complete LED packaging structure; wherein the mixed packaging adhesive (5) is a mixture of fluorescent powder and diamond, and the adhesive is a solid crystal glue or silver glue.

7. The LED packaging structure according to claim 1, wherein the bracket (4) is one of a metal bracket, a thermal conductive plastic bracket, and a crystal bracket.

8. The LED packaging structure according to claim 1, wherein a preparation method of the bracket (4) comprises the following steps:
S1. preparing a thermal conductive layer by uniformly mixing 100% thermal conductive silicone grease composite material, 20% to 40% diamond, and 10% to 30% ceramic powder by mass ratio;
S2. fusing and stirring 10% to 30% nickel, 100% aluminum, and 100% copper by mass ratio at a high temperature to prepare a metal plate; and
S3. after preparing the metal plate into the desired bracket, applying the thermal conductive layer onto the bracket.

9. The LED packaging structure according to claim 8, wherein a preparation method of the thermal conductive layer comprises: adding a total of 30% of diamond powder and a total of 65% of ceramic powder into the thermal conductive silicone grease composite material at a temperature of 25° C.-30° C., stirring the material for fusion, then heating, after the fusion, the mixture to 75° C. at a heating rate of 2-4° C./min, and maintaining the temperature for 30-65 min; and after the thermal insulation is completed, cooling the mixture to 45-50° C. at a cooling rate of 1-2° C./min, then continuing to add the remaining diamond powder and ceramic powder, and stirring the material for fusion, wherein the fusion is carried out in an environment of ultrasonic dispersion for 20 to 45 min at a second fusion frequency of 250 Hz to 600 Hz and the power of 200 to 250 W, thus obtaining the thermal conductive layer after the fusion.

10. The LED packaging structure according to claim 9, wherein a preparation method of the thermal conductive silicone grease composite material includes: adding bentonite and sodium dodecyl sulfate into silicone grease at the room temperature, stirring the components for modification, and performing ultrasonic dispersion for 30 to 60 min at a frequency of 200 Hz to 500 Hz and the power of 100 to 200 W to obtain the thermal conductive silicone grease composite material; and a mass ratio of the thermal conductive silicone grease, the bentonite, and the sodium dodecyl sulfate is 1:0.4:0.2.

11. The LED packaging structure according to claim 1, wherein a mounting method of the internal circuit comprises: spraying a layer of insulating oil on the bracket first, spraying powder or coating an insulating layer on the metal bracket, then brushing a silver layer on a top of the metal bracket, and mounting the internal circuit.

12. The LED packaging structure according to claim 1, wherein a mounting method of the internal circuit is a packaging technology for directly bonding a flexible circuit board such as a flexible printed circuit (FPC) or other high-temperature-resistant flexible insulating circuit board to a specially-shaped metal or alloy bracket.

* * * * *